United States Patent
Pedersen et al.

(10) Patent No.: US 9,151,789 B2
(45) Date of Patent: Oct. 6, 2015

(54) LOW POWER CAPACITIVE TOUCH DETECTOR

(75) Inventors: Frode Milch Pedersen, Trondheim (NO); Kristoffer Koch, Trondheim (NO)

(73) Assignee: Atmel Corporation, San Jose, CA (US)

( * ) Notice: Subject to any disclaimer, the term of this patent is extended or adjusted under 35 U.S.C. 154(b) by 1056 days.

(21) Appl. No.: 13/233,589

(22) Filed: Sep. 15, 2011

(65) Prior Publication Data

US 2013/0069671 A1    Mar. 21, 2013

(51) Int. Cl.
| | |
|---|---|
| *G01R 27/26* | (2006.01) |
| *G06F 3/044* | (2006.01) |
| *H03K 17/96* | (2006.01) |
| *H03K 17/955* | (2006.01) |

(52) U.S. Cl.
CPC .............. *G01R 27/26* (2013.01); *G06F 3/044* (2013.01); *H03K 17/955* (2013.01); *H03K 17/962* (2013.01); *H03K 2217/960715* (2013.01)

(58) Field of Classification Search
None
See application file for complete search history.

(56) References Cited

U.S. PATENT DOCUMENTS

| | | |
|---|---|---|
| 5,920,309 A | 7/1999 | Bisset et al. |
| 6,753,853 B1 | 6/2004 | Dotson |
| 6,970,160 B2 | 11/2005 | Mulligan et al. |
| 7,375,535 B1 | 5/2008 | Kutz et al. |
| 7,504,833 B1 * | 3/2009 | Seguine .................. 324/672 |
| 7,843,249 B2 | 11/2010 | Zhang et al. |
| 7,952,366 B2 | 5/2011 | Philipp et al. |
| 2008/0179112 A1 * | 7/2008 | Qin et al. ................ 178/18.06 |
| 2009/0027068 A1 * | 1/2009 | Philipp et al. ............. 324/678 |
| 2009/0073140 A1 * | 3/2009 | Fujita et al. .............. 345/174 |
| 2010/0053097 A1 * | 3/2010 | Goh et al. ................. 345/173 |
| 2012/0050206 A1 * | 3/2012 | Welland .................... 345/174 |

OTHER PUBLICATIONS

China Office Action; Yilan; May 31, 2012; China; 201120564005.9; 18.

* cited by examiner

*Primary Examiner* — Melissa Koval
*Assistant Examiner* — Stephen G Armstrong
(74) *Attorney, Agent, or Firm* — Fish & Richardson P.C.

(57) ABSTRACT

A low power capacitive detector is disclosed. The detector includes a mechanism to measure and detect touch on capacitive sensors. The detector uses signal processing to suppress noise and increase sensitivity. The detector does not require dedicated analog circuitry, making it easy to adopt in a microcontroller system. The detector can be scaled to a larger number of capacitive sensors without noticeable increase in silicon cost.

20 Claims, 3 Drawing Sheets

LOW POWER CAPACITIVE TOUCH DETECTOR

TECHNICAL FIELD

This disclosure relates generally to electronics and more particularly to capacitive touch sensors.

BACKGROUND

Capacitive sensors increasingly replace mechanical buttons in consumer and handheld equipment. They are low cost and robust, as they require no mechanical components, and can sense the presence of a finger through a dielectric material, such as an encapsulation or glass. The capacitive sensors are usually detected by measuring the self-capacitance of the sensor, which will change up to a few percent when touched. If the detection is sensitive enough then proximity detection is also possible. Proximity detection allows detection of an approaching finger from a distance. This can be used to wake a device from a low power state before the application is physically touched. It is therefore particularly important to be able to detect proximity while using as little power as possible.

A disadvantage with capacitive sensors is that they have high impedance, making the sensors sensitive to electrical noise in the environment. The capacitance value can drift with environmental conditions, such as temperature and moisture. The challenge in capacitive sensing is producing an accurate capacitance measurement and distinguishing the signal from the noise and drift while consuming as little power as possible.

There are several conventional techniques in use to detect a change in self-capacitance of a capacitive sensor when touched or approached by a finger. One technique uses two I/O pins with a sensing capacitor between them. One of the input/output (I/O) pins is connected to the sensor. A switching sequence on each I/O driver pumps capacitance into the sensor capacitance until the I/O pin input threshold is reached. The drawback to this technique is that two I/O pins are needed, an external capacitor is needed and power is wasted by charging and discharging the sensor. In addition, noise rejection is limited.

Another technique uses an I/O pin to charge the sensor before sampling it with an analog-to-digital converter (ADC). The charge is shared between the sensor and a sample and hold (S/H) capacitor. The measurement is repeated with opposite charge on the sensor. This dual-slope measurement cancels low-frequency noise. However, there is no suppression of high frequency noise, apart from oversampling a large number of times, which is slow and requires power. In addition, the ADC must be used for sensing, limiting its use for other functions in an application. Only pins connected to the ADC input can be sensed, limiting the number of sensors in the system. Software is required for touch processing and detection.

In yet another technique, a microcontroller includes circuitry that can inject a fixed charge into the sensor capacitance and the S/H capacitor of the ADC. The resulting voltage on the ADC S/H capacitor can then be measured during conversion. This does not provide any noise rejection and software is required to process and detect touch.

In still another technique, the sensor pin is made to oscillate by charging it with a known current and comparing it to a fixed reference voltage. The resulting frequency is compared to a known frequency. The measurement sequence is long, and a large number of charge/discharge cycles are needed, resulting in wasted power. In addition, there is no noise rejection.

SUMMARY

A capacitive sensor is coupled between digital I/O pins of an integrated circuit (IC) package, such as a microcontroller. A parasitic capacitor of the capacitive sensor is charged through one of the digital I/O pins, and then discharged through an external resistor coupled between the digital I/O pins. A discharge of the parasitic capacitor is timed using a capacitance counter. The count value at the end of the discharge period reflects a resistor-capacitor (RC) time constant of an RC circuit formed by the parasitic capacitor and the external resistor. The raw count representing the sensor's self-capacitance can be filtered to remove low, medium and high frequency noise in the count, and then compared to one or more threshold values of one or more state detectors, the output(s) of which can be used to determine a touch event (e.g., physical touch, proximity touch, out-of-touch).

Particular implementations of a low power capacitive touch detector provide one or more of the following advantages. The detector allows capacitive touch detection with small and low cost external components. The detector can be used on any digital I/O pins in a microcontroller. The detector does not depend on an ADC. The detector suppresses noise in all frequency bands, providing increased sensitivity. The detector allows both touch and proximity detection.

The details of one or more disclosed implementations are set forth in the accompanying drawings and the description below. Other features, aspects, and advantages will become apparent from the description, the drawings and the claims.

DETAILED DESCRIPTION

Exemplary Low Power Touch System

Figure 1:
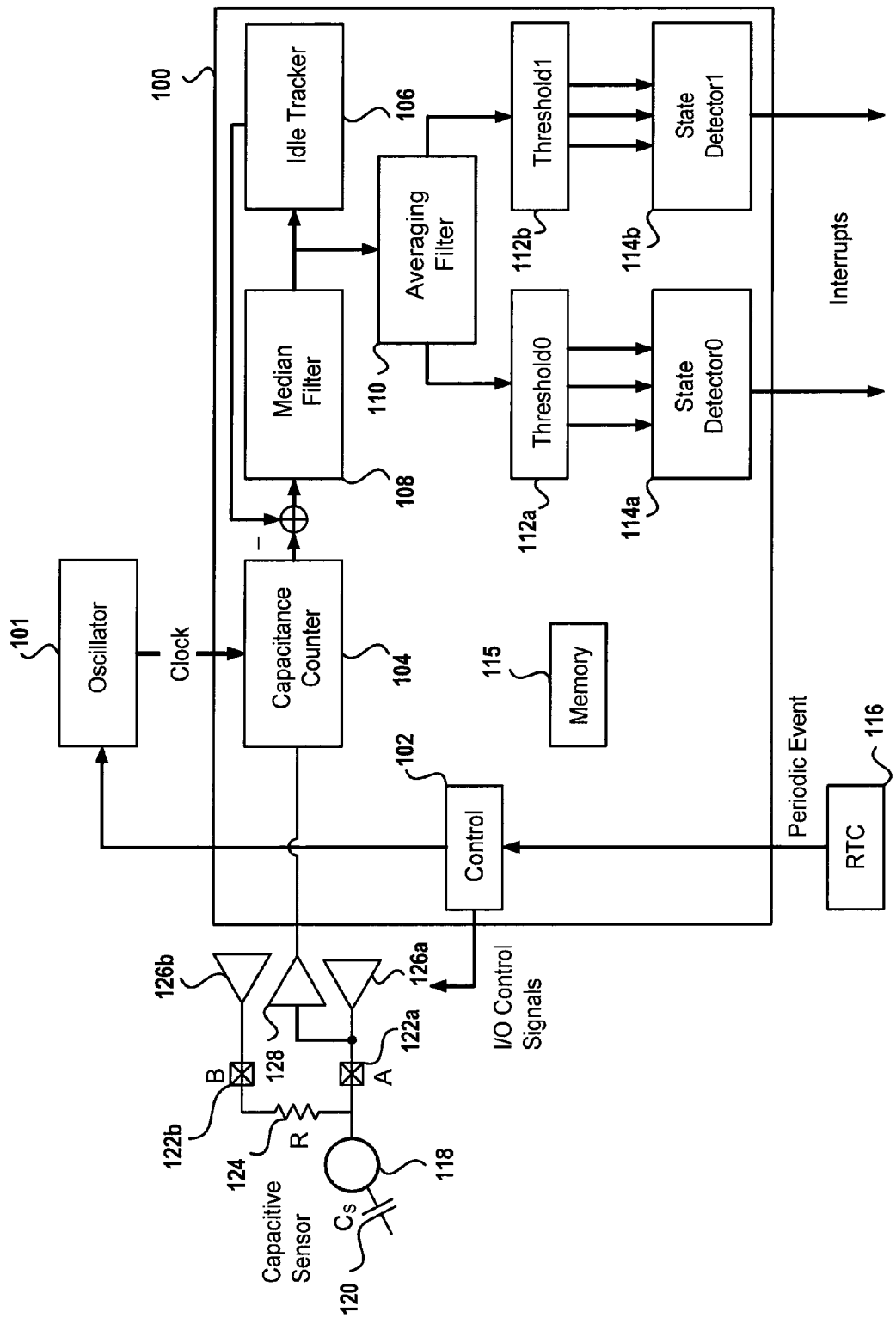
FIG. 1 is a simplified block diagram of an exemplary low power capacitive touch detector system coupled to a capacitive sensor.

FIG. 1 is a simplified block diagram of an exemplary low power capacitive touch detection system coupled to a capacitive sensor. In some implementations, system 100 is part of an integrated circuit, such as a microcontroller or application-specific integrated circuit (ASIC). In the example, system 100 is integrated with drivers 126a, 126b and input buffer 128 in an IC package having digital I/O pins 122a ("A") and 122b ("B"). System 100 can include control module 102, capacitance counter 104, idle tracker 106, median filter 108, averaging filter 110, threshold detectors 112a, 112b and state detectors 114a and 114b.

System 100 can be coupled to capacitive sensor 118 through digital I/O pins 122a and 122b. The self-capacitance of capacitive sensor 118 can be modeled as a parasitic capacitor 120 ("Cs") between capacitive sensor 118 and "Earth" (free-space return). External resistor 124 ("R") is coupled between pins 122a and 122b, which are coupled to digital I/O pads, preferably with slew-rate control to reduce electromagnetic interference (EMI). Drivers 126a, 126b and input buffer 128 are typically part of the I/O pad circuitry. I/O pad circuitry can also include protective circuitry (e.g., diodes).

Oscillator 101 (e.g., a high-frequency RC oscillator) provides a clock to capacitance counter 104. Oscillator 101 can be included in the IC package or external to the IC package. Real-time Clock 116 (RTC) is coupled to control module 102 and provides periodic event signals to control module 102. RTC 116 can be included in the IC package or external to the IC package.

Exemplary Acquisition

In some implementations, a capacitance acquisition starts by driver 126a driving digital I/O pin 122a and charging parasitic capacitor 120 to a first voltage level (e.g., Vdd). Driver 126b then drives digital I/O pin 122b to a second voltage level that is lower than the first voltage level, resulting in parasitic capacitor 120 discharging through resistor 124. During discharging, capacitance counter 104 counts the number of clock cycles that input buffer 128 reads as logic "0". For example, a series of data read from input buffer 128 over 32 clock cycles can be 00000010000000000010111111111111. For this data series example, capacitance counter 104 counts "18" (the number of zeros in the data series). The resulting count value provided by capacitance counter 104 is proportional to the parasitic capacitance of capacitive sensor 118. The counting can continue for a fixed number of clock cycles. For example, if the maximum expected count value is 1024, capacitance counter 104 can count for 1024 clock cycles.

The sequence described above can be repeated, but with digital I/O pin 122a driven to "0" and digital I/O pin 122b driven to "1". During the discharging, capacitance counter 104 counts the number of clock cycles that input buffer 128 reads as logic "1". Using the example series of data above, the count would be "14", which is the number of ones in the example data series.

The count values from the two measurements can then be added with the resulting value being a single measurement of capacitance. These "dual-slope" capacitance measurements performed in rapid succession cancel any low frequency noise, such as 50-60 Hz noise usually contributed by a main power supply.

The measured count value is proportional to the product of parasitic capacitance 120 and resistor 124 (RC time constant) and the frequency of oscillator 101. For a given application, resistor 124 can be a variable resistor that can be adjusted to give sufficient time (count value) for the signal to be measured. Typically, this count value is in the range of 100 counts for touch detection and 1000 counts for proximity detection.

Exemplary Signal Processing

Even if low frequency noise is rejected by the dual-slope measurement technique, medium and high frequency noise can also be picked up by capacitive sensor 118. High frequency noise is seen as a "white" uncorrelated noise added to the correct capacitance value. This additive noise can be removed by median filter 108. In some implementations, median filter 108 can be a median-3 filter and use memory 115 to store three consecutive count values to compute the median of those count values.

The output of median filter 108 is fed to averaging filter 110. In some implementations, averaging filter 110 can be a fast moving average filter, which suppresses medium-frequency noise in the acquired measurement.

Idle tracker 106 compensates for capacitance drift by feeding the output of median filter 108 to a slow moving average filter. Idle tracker 106 uses the output of median filter 108 to determine a baseline or "idle" capacitance value that is output by capacitive sensor 118 when untouched. Filters 108, 110 and 106 can be implemented in hardware, firmware, or software or some combination thereof. For low power applications, filters 108, 110 and 106 are preferably implemented in hardware.

In some implementations, an integer part of the "idle" value computed by idle tracker 106 is subtracted from the measured capacitance output from capacitance counter 104 by means of a saturating subtraction. Saturating subtraction limits the difference to a fixed range between a minimum and maximum value. If the result of the subtraction is greater than the maximum value, it is set to the maximum. If the result is below the minimum, value it is set to the minimum. Since the absolute value of this difference is much smaller than the measured capacitance output from capacitance counter 104, the number of bits needed for processing is reduced, resulting in reduced cost and power consumption.

This implementation has the further advantage that the average value of median filter 108 output is zero. The output of average filter 110 then represents the difference between the "idle" value and the measured capacitance output by capacitance counter 104. This allows a direct comparison against threshold 112 without subtracting the "idle" value first.

Exemplary Detection

One or more state detectors (e.g., state detectors 114a, 114b), perform detection by comparing the fast moving average output by averaging filter 110 to one or more thresholds (e.g., thresholds 112a and 112b). The one or more thresholds 112 can be defined by a user. Capacitive sensor 118 is "in detect" when the fast moving average exceeds threshold 112. In some implementations, an "in detect" condition produces an interrupt to a Central Processing Unit (CPU) or other device. In the example shown, two state detectors 114a, 114b and their corresponding thresholds 112a, 112b allow varying degrees of sensitivity for capacitive sensor 118. For example, threshold 112a can be used to detect physical touch events and threshold 112b can be used to detect proximity events. In some implementations, a threshold and detector can be used to detect long touches, which could cause idle tracker 106 to output negative values.

Optional Extensions

Differential Sensor Support

The process described above describes sensing conventional self-capacitance sensors. One drawback of these sensors is that the signal is sensitive to the coupling of the sensor as well as the sensing circuit to Earth. This coupling can be small for handheld equipment, reducing the signal strength to the point that a touch is not detected.

To overcome this issue, it is possible to use a mutual capacitance sensor, which includes two sensor halves, where the capacitance changes according to the electric field between the sensors. The mutual capacitance does not depend on the coupling to Earth.

Figure 2:
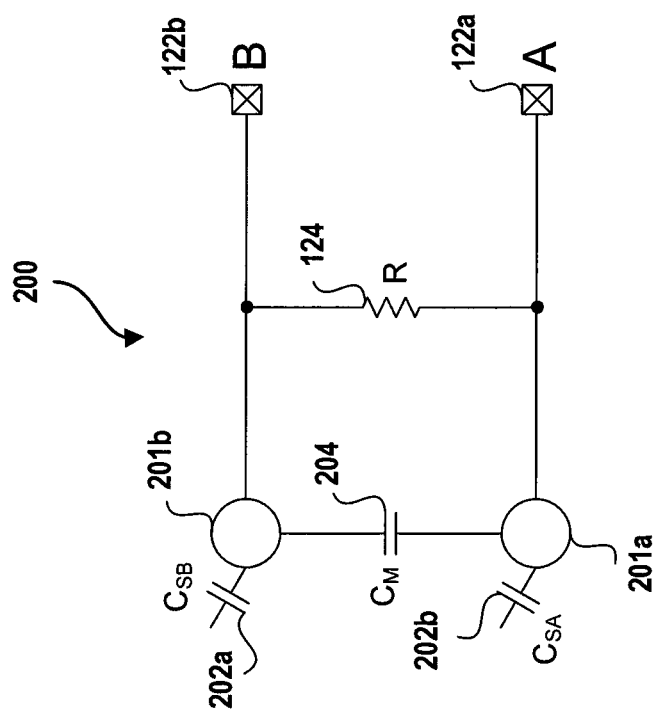
FIG. 2 illustrates an exemplary differential capacitive sensor.

FIG. 2 illustrates an exemplary differential capacitive sensor. In some implementations, mutual capacitance sensors can be used instead of self-capacitance sensors, as shown in FIG. 2. In this case, each half of capacitive sensor 201a, 201b is connected to digital I/O pins 122a, 122b. The process described above is otherwise unchanged. The measured capacitance will be sensitive to changes in self-capacitance 202a, 202b and mutual capacitance 204. Capacitive sensor 201 thus provides a signal even in an application with poor Earth coupling, providing a more robust solution than a pure self-capacitance solution.

Sampled Operation

System 100 contains the control logic for starting oscillator 101, performing acquisition, signal processing and detection. System 100 can thus operate in a "sampled" manner, by which an ultra-low power RTC 116 (e.g., a 32 KHz real-time RTC) can produce periodic events, which activate system 100 periodically. The average power can then be determined by the time required to perform the measurement, the current consumption when active, and the interval between sampling periods. Since system 100 does not require any high power consumption analog circuits, and the signal processing allows even weak signals to be identified rapidly, the "on" time of system 100 is limited, saving power considerably compared to conventional.

Internal Discharge

It is possible to eliminate external resistor 124 by relying on pull-up and pull-down functions in I/O pads. The resistive value of the internal pull-up resistors of conventional I/O pads is relatively low when compared to external resistor 124, so the measured count value will be low. This can still be an option if only physical touch should be detected, and Earth coupling is good, providing a strong signal from capacitive sensor 118. A drawback of this method is that the signal value is small due to the rapid discharge caused by the low resistance value of the internal pull-ups resistors. This can be compensated by repeating the measurement cycle and accumulating multiple measurements to produce a single result to be processed by the digital filters.

Multiple Sensors

System 100 only relies on conventional I/O pads, so it can be extended to support multiple sensors at relatively little cost. Since the time it takes to measure and detect a sensor is much shorter than the sampling interval, it is possible to use the same logic to support multiple sensors. In this case, the sensors can be sequentially measured and detected, controlled by a sequencer. The sequencer can configure idle tracker 104, averaging filter 110, and state detectors 114a, 114b for each sensor before the measurement. After the measurement and detection, the new state of idle tracker 104 and averaging filter 110 can be stored, before progressing to the next sensor. A register bank or circular buffer in memory can be used to store the affected registers. The cost of this approach may be less than supporting multiple sensors by multiple independent instances of system 100.

Exemplary Process

Figure 3:
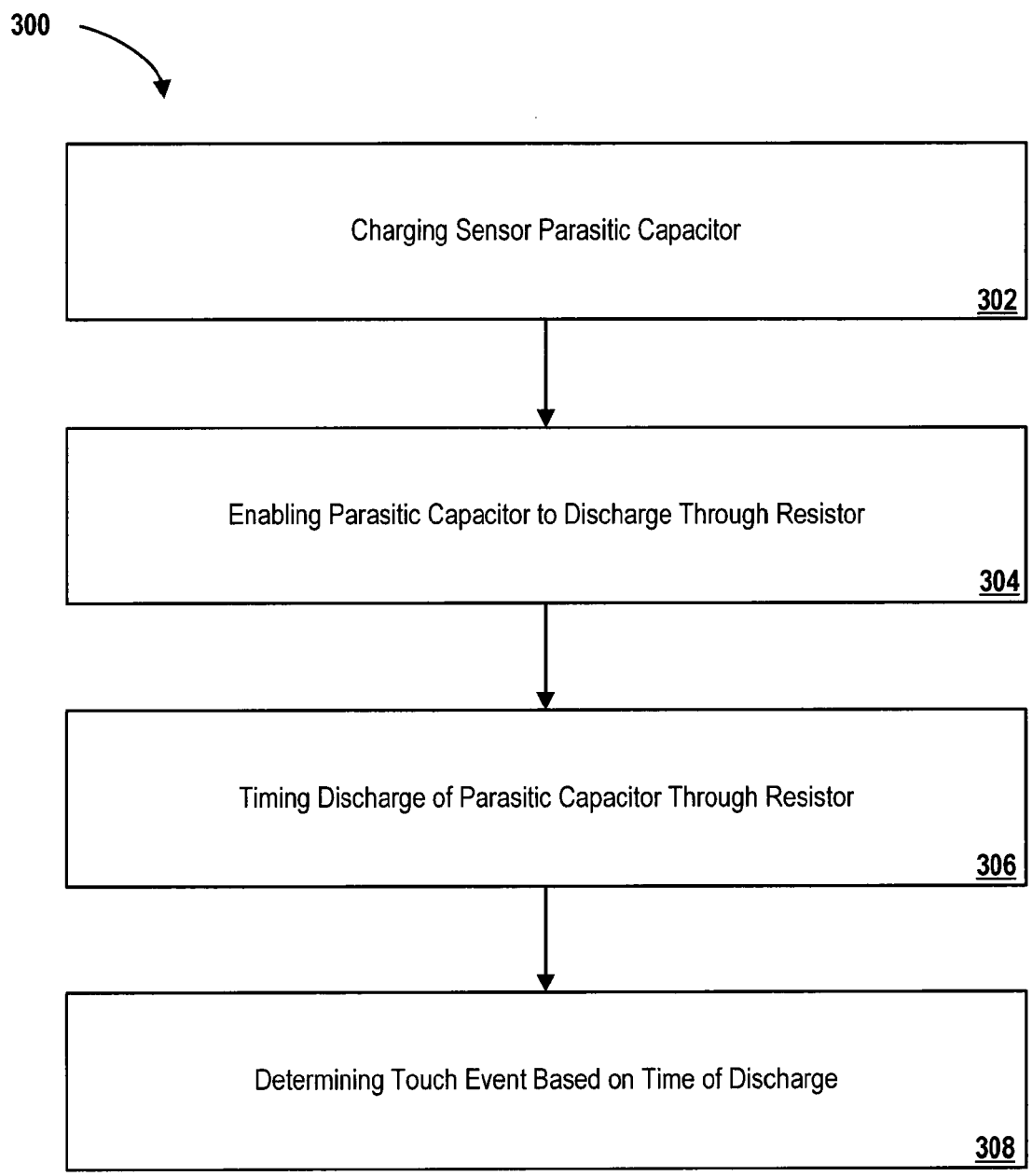
FIG. 3 is a flow diagram of an exemplary process for detecting capacitive touch.

FIG. 3 is a flow diagram of an exemplary process 300 for detecting capacitive touch. Process 300 can be implemented by system 100 of FIG. 1.

In some implementations, process 300 can begin by charging a sensor capacitor (302). For example, the capacitive sensor can be coupled to a first digital I/O pin of an IC package (e.g., a microcontroller). A driver of an digital I/O pad for the first digital I/O pin can be used to charge a parasitic capacitor of the capacitive sensor.

Process 300 can continue by enabling the sensor capacitor to discharge through a resistor (304). For example, the capacitive sensor can also be coupled to a second digital I/O pin of the IC package. A driver of an digital I/O pad for the second I/O pin can be used to drive voltage onto the second digital I/O pin, resulting in the charge on the parasitic capacitor discharging through an external resistor coupled between the I/O pins.

Process 300 can continue by timing the discharge of the sensor capacitor through the resistor (306). For example, an oscillator can be coupled to a capacitance counter to time the discharge of the parasitic capacitor through the external resistor. A count value at the end of the discharge period reflects the RC time constant of the RC circuit formed from the parasitic capacitor and the external resistor. The end of discharge period can be determined by examining an input buffer value for the first I/O pin and monitoring when it changes its logic value.

Process 300 can continue by detecting a touch event based on the time of discharge (308). For example, the raw capacitance measurement can be filtered to remove low, medium and high frequency noise, and then compared to one or more threshold values of one or more state detectors to determine the touch event (e.g., physical touch, proximity touch, out-of-touch). The one or more state detectors can provide an interrupt to a CPU or other device based on results of the comparison.

The disclosed implementations of a low power capacitive touch detector allow low cost, low power, high sensitivity robust capacitance measurements by a combination of several mechanisms. Instead of depending on dedicated analog circuitry, the disclosed implementations rely on integration with conventional microcontroller features, such as I/O pads, an RC oscillator and a real-time clock. Sensitivity can be selected by the user by tuning an external resistor. The implementations work with single-ended self-capacitance sensors and differential mutual-capacitance sensors, ensuring robustness even in poor earth coupling conditions. The implementations use effective acquisition and filtering techniques to remove low, medium, and high frequency noise, as well as capacitance drift. Due to the efficient noise rejection, the capacitive sensor does not need to be charged and discharged many times, which saves a significant amount of power compared to traditional techniques. The implementations can be self-controlled, allowing it to work in sampled operation, only consuming power during the actual measurement and signal processing. The implementations work without software interaction, making it suitable to process touch detection and wake the CPU. This makes it ideal for use in low-power modes, unlike software-dependent algorithms. The implementations can easily be scaled to a high number of sensors by dynamic reconfiguration and sequential operation of the invention.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method of detecting a capacitive touch input, the method comprising:
   charging a parasitic capacitor of a capacitive sensor;
   enabling the parasitic capacitor to discharge through a resistor coupled to the parasitic capacitor, wherein the discharge is in a first current direction through the resistor;
   timing the discharge of the parasitic capacitor through the resistor to produce a first discharge time; then
   charging the parasitic capacitor again;
   enabling the parasitic capacitor to discharge through the resistor in a second current direction opposite to the first current direction;
   timing the discharge of the parasitic capacitor through the resistor to produce a second discharge time; and
   detecting a touch event based on the first discharge time and the second discharge time.

2. The method of claim 1, where charging and discharging the parasitic capacitor further comprises:
   driving a first voltage onto a first digital input/output (I/O) pin of an integrated circuit (IC) package, the first digital I/O pin coupled to the capacitive sensor;
   driving a second voltage onto a second digital I/O pin of the integrated circuit package to enable the parasitic capacitor discharge through the resistor in the first current direction, the second digital I/O pin coupled to the capacitive sensor and the second voltage being less than the first voltage, the resistor coupled between the parasitic capacitor and the second digital I/O pin;
   timing a first discharge of the parasitic capacitor through the resistor to produce the first discharge time;
   driving the second voltage onto the first digital input/output (I/O) pin;
   driving the first voltage onto the second digital I/O pin to enable the parasitic capacitor discharge through the resistor in the second current direction;
   timing a second discharge of the parasitic capacitor through the resistor to produce the second discharge time; and
   adding the first and second discharge times.

3. The method of claim 2, where the first and second digital I/O pins are coupled to digital I/O pads with slew-rate control to reduce electromagnetic interference.

4. The method of claim 1, where timing the discharge of the parasitic capacitor through the resistor further comprises:
   running a counter for a discharge period, where a raw count value at the end of the discharge period is proportional to a parasitic capacitance of the parasitic capacitor, a resistance of the resistor, and a frequency of an oscillator providing a clock to the counter.

5. The method of claim 4, further comprising:
   filtering the raw count value with a median filter.

6. The method of claim 5, further comprising:
   filtering the median filter output using a fast moving averaging filter.

7. The method of claim 6, wherein detecting a touch event based on the time of discharge, further comprises:
   comparing the output of the fast moving averaging filter to one or more threshold values; and
   performing an action based on the comparing.

8. The method of claim 7, where the action includes generating an interrupt signal to a central processing unit or other device.

9. The method of claim 5, further comprising:
   compensating for drift by feeding median filter output to a slow moving average filter;
   outputting from the slow moving average filter an idle value of the capacitive sensor; and
   subtracting an integer portion of the idle value from the raw count value.

10. The method of claim 9, where the subtracting is saturation subtracting.

11. A capacitive touch detection system, comprising:
    a capacitance counter configured to generate a count value proportional to a parasitic capacitance of a parasitic capacitor of a first capacitive sensor coupled to the capacitance counter, the count value being generated based on a number of first occurrences and a number of second occurrences, the number of first occurrences being counted when an input signal detected by the capacitance counter has a first value during a first time period and the number of second occurrences being counted when the input signal has a second, different value during a second time period successive to the first time period;
    a signal processing subsystem configured for processing the count value; and
    one or more detectors configured for detecting a touch event based on the processed count value exceeding one or more threshold values.

12. The system of claim 11, further comprising:
    digital input/output (I/O) pins coupled to the first capacitive sensor and the capacitance counter through digital I/O pads, the digital I/O pads including drivers;
    a resistor coupled between the digital I/O pins;
    a control module coupled to the drivers, the control module providing signals to the drivers to initiate the driving of voltage onto the digital I/O pins to charge or discharge the parasitic capacitor; and
    an oscillator coupled to the control module and the capacitance counter, the oscillator providing a clock to the capacitance counter in response from a start signal from the control module.

13. The system of claim 12, where the digital I/O pads include slew-rate control to reduce electromagnetic interference.

14. The system of claim 12, where the oscillator is a resistor-capacitor (RC) oscillator.

15. The system of claim 12, where the signal processing subsystem further comprises:
    a median filter coupled to the first capacitive sensor and configured to filter the count value;
    a first moving average filter coupled to the median filter and configured to filter the median filter output to produce the processed count value;
    a second moving average filter, slower than the first moving average filter, coupled to the median filter output, the second moving average filter configured for filtering the median filter output to generate an idle value to be subtracted from the count value output by the capacitance counter.

16. The system of claim 15, where the subtraction is a saturated subtraction.

17. The system of claim 12, further comprising:
    a real-time clock coupled to the control module for providing periodic event signals to the control module, the periodic event signals for activating the control module periodically to initiate capacitive touch detection.

18. The system of claim 12, where the first capacitive sensor is a differential capacitive sensor.

19. The system of claim 11, further comprising:
a second capacitive sensor; and
a sequencer coupled to the first and second capacitive sensors, the sequencer for configuring the signal processing subsystem for each capacitive sensor and the one or more detectors, before the count value is generated.

20. The system of claim 19, further comprising:
memory configured for storing states of first and second moving average filters for the first and second capacitive sensors.

* * * * *